United States Patent [19]

Murata

[11] Patent Number: 5,510,636
[45] Date of Patent: Apr. 23, 1996

[54] MASTER-SLICE TYPE SEMICONDUCTOR DEVICE

[75] Inventor: Masaomi Murata, Ichikawa, Japan

[73] Assignee: Kawasaki Steel Corporation, Hyogo, Japan

[21] Appl. No.: 359,018

[22] Filed: Dec. 19, 1994

Related U.S. Application Data

[63] Continuation of Ser. No. 172,915, Dec. 27, 1993, abandoned.

[30]     Foreign Application Priority Data

Dec. 28, 1992 [JP] Japan .................................. 4-349281

[51] Int. Cl.⁶ .................................................... H01L 27/10
[52] U.S. Cl. .......................... 257/206; 257/210; 257/204
[58] Field of Search ................................. 257/204, 206, 257/208, 210

[56]             References Cited

FOREIGN PATENT DOCUMENTS 63-187647   8/1988   Japan ..................................... 257/208
1-19743   1/1989   Japan ..................................... 257/204

*Primary Examiner*—Jerome Jackson, Jr.
*Assistant Examiner*—John F. Guay
*Attorney, Agent, or Firm*—Oliff & Berridge

[57]             ABSTRACT

A master-slice type semiconductor device according to the present invention comprises a cell array on a main surface thereof, the cell array is constituted into a shape of matrix by adjoining channel regions each other, and the channel region has one of a P-channel type and a N-channel type. The cell array is constituted by a plurality of column patterns, and the channel region constituting a first column pattern is the same channel type as the adjoining channel region constituting a second column pattern. As a feature of the structure, the column pattern comprises a basic all including a P-channel region and two N-channel regions which are the same in figure and size.

10 Claims, 9 Drawing Sheets

Fig.13

| P | N | N | P | N | N | P | N | N | P | N | N |
| P | N | N | P | N | N | P | N | N | P | N | N |
| P | N | N | P | N | N | P | N | N | P | N | N |
| P | N | N | P | N | N | P | N | N | P | N | N |

BCl1 — 53a — BCl2 — BCl2 — 53b

Fig.12

| P | N | N | P | N | N | P | N | N | P | N | N |
| P | N | N | P | N | N | P | N | N | P | N | N |
| P | N | N | P | N | N | P | N | N | P | N | N |
| P | N | N | P | N | N | P | N | N | P | N | N |

BCl1 — 53a — BCl2 — 53b — BCl1

MASTER-SLICE TYPE SEMICONDUCTOR DEVICE

This is a continuation of application Ser. No. 08/172,915 filed Dec. 27, 1993, now abandoned.

BACKGROUND OF THE INVENTION

1. Field of the Invention

The present invention relates to a structure of a master-slice type semiconductor device, and more particularly relates to a structure of a cell array which is on a main surface thereof and formed into a shape of matrix by adjoining channel regions each other.

2. Related Background Art

Conventionally, in a case Of manufacturing a gate-array type semiconductor device and belongs to the field of the present invention, first a plurality of regions of a predetermined channel type is formed on a semiconductor wafer by doping a suitable impurity into the wafer. In the regions, there are a region (BC-P) in which a p-type active layer 30p is formed, and regions (BC-N1, BC-N2) in which an N-type active layer 30n is formed, and these regions are arrayed regularly to form a matrix shaped cell array. Continuously a gate electrode 40 is formed on the gate oxide in each active region. The semiconductor wafer at this stage is generally called master-slice (See FIG. 1).

Here, the general array of the P-type active layer and the N-type active layer (both constitute the cell array) for constituting the master-slice is shown in FIG. 2. In FIG. 2, regions indicated by a reference mark P and a reference mark N represent a P-channel region in which a P-channel transistor is formed and an N-channel region in which an N-channel transistor is formed, respectively. In this example, one P-channel region and a pair of a large and small N-channel regions form one basic cell.

It is noted that reference marks BC1 and BC2 represent a group of basic cells. Further, in FIG. 1 and FIG. 2, the P-channel region is indicated by BC-P, the N-channel region having a large area is indicated by BC-N1 (hereinafter called the first N-channel region), and the N-channel region having a small area is indicated by BC-N2 (hereinafter called the second N-channel region).

As shown in FIG. 1, for the ratio of area of each channel region constituting one basic cell, P-channel region (BC-P): the first N-channel region (BC-N1): the second N-channel region (BC-N2) is approximately 1:1:0.5.

Reasons for setting the area of each channel region constituting the basic cell to the above ratio are as follows.

In a case that a simple logical gate such as a NAND and a NOR, or a flip-flop is formed, usually a pair of one N-channel region and one P-channel region is utilized. In that case, for example, if an invertor is constituted in the aforesaid N-channel region, a gate width needs to be large, so that the N-channel region requires an area in which the gate width can be satisfactory wide taken (the first N-channel region BC-N1 is utilized).

On the other hand, in a case of forming a RAM, a transfer gate is further required. The transfer gate does not require a large driving capacity, so that the N-channel region which has a small area is utilized from the view point of an area efficiency (the second N-channel region BC-N2 is utilized).

Thus, conventionally one F-channel region (BC-P) and a pair of a large and small N-channel regions (BC-N1, BC-N2) constitute one basic cell. In the conventional master-slice, a combination of these three channel regions (a basic cell) is one constituent unit. In forming a circuit block by applying metal wiring, a simple logical gate can be wired on the basic cells which it was to be formed, but there needs a wiring region to wire between each logical gates. Accordingly, in a case of forming a wiring region shown as oblique lines in FIG. 2, a whole region in which one basic cell is to be formed is assigned for the wiring region, and the wiring region 20 has to be formed in an upper surface of the region. Usually, for the most cases, the wiring region 20 is formed on the both sides (equivalent to the upper and bottom side of FIG. 2) of each basic cell, therefore it is difficult to increase a use rate of gate to above 50%.

SUMMARY OF THE INVENTION

It is an object of the present invention to provide a master-slice type semiconductor device which comprises a cell array with a structure in which a high use rate of gate can be obtained.

A master-slice type semiconductor device according to the present invention comprises a cell array on its main surface, the cell array is formed into a shape of matrix by adjoining basic cell each other, and the basic cell has one of a first channel type and a second channel type.

FIG. 3 is a plain view showing a structure of a master-slice type semiconductor device according to the present invention, and as shown in FIG. 3, a main surface of the semiconductor wafer comprises a cell array 2 which the basic cells 3 are arrayed into a shape of matrix and a space only for the wiring is not included in the cell array 2.

The structure of the basic cell is shown in FIG. 4. The basic cell was constituted with 3 channel regions, and comprises the first region 51 and second region 52. The first region 51 is P-channel region in which P-channel transistor is to be formed. The second region 52 is constituted with a pair of N-channel regions in which N-channel transistor is to be formed, and a pair of N-channel regions are same figure and same size as each other.

The whole region in which one basic cell is formed is not required for the wiring region. One P-channel region or one pair of N-channel regions is utilized for the wiring region. In the present invention, the two N-channel regions constituting the second region are formed to the same figure and to the same size, and considering the symmetric property of the column pattern, the wiring region is constituted. Accordingly, for example, in the column pattern, if each channel region 4 is formed in order of P-N-N-P-N-N-P (FIG. 9), among the channel regions, the central P-channel region 53a is used in common as the wiring region (wiring region in FIG. 7), the basic cells of "P-N-N" (FIG. 5) and "N-N-P" (FIG. 6) are formed. In result the basic cells having the same structure can be formed into the inverse of the other cell. This is the same for the case of constituting one pair of N-channel regions (structure is the same as the second region) as the wiring region (FIG. 8).

In the conventional master-slice type semiconductor device, since a pair of N-channel regions 52 are not as same figure and size as each other, the whole region of "P-N-N" constituting one basic cell (FIG. 1) has to be utilized for the wiring region. On the other hand, the master-slice type semiconductor device according to the present invention, although the case of taking the wiring region in each column pattern 4, symmetry of each basic cell can be kept, so that the unnecessary wiring region does not exist.

The present invention will become more fully understood from the detailed description given hereinbelow and the

BRIEF DESCRIPTION OF THE DRAWINGS

FIG. 12 and FIG. 13 are views showing an example of detailed array condition of a circuit block.

DETAILED DESCRIPTION OF THE PREFERRED EMBODIMENTS

Figure 1:
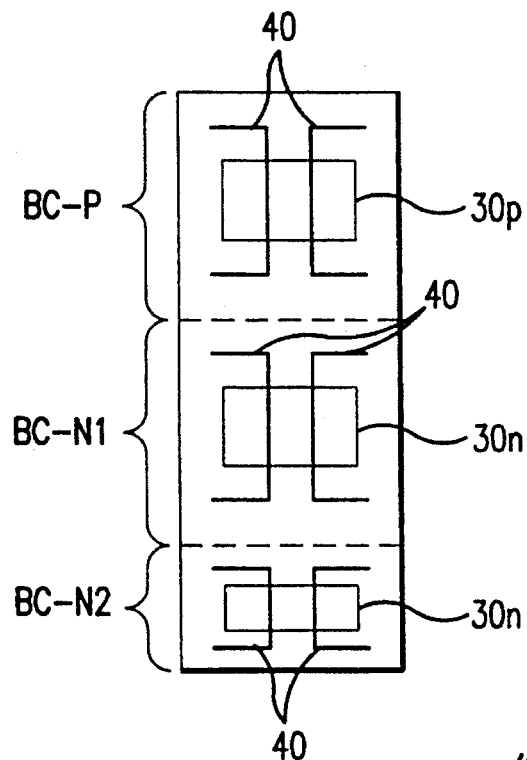
FIG. 1 is a plane view showing a detailed structure of a conventional basic cell.
Figure 2:
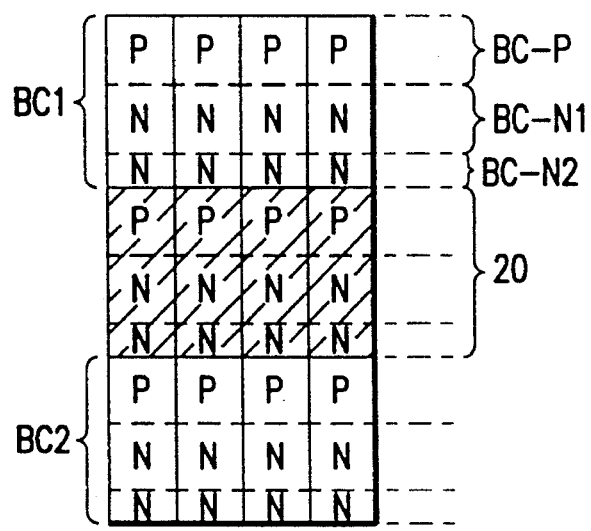
FIG. 2 is a plane view showing a conventional array of a cell array formed on a main surface of a semiconductor wafer.
Figure 3:
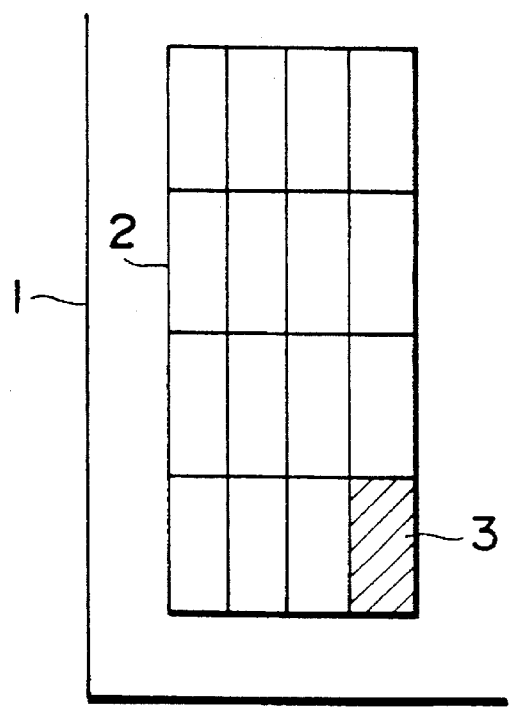
FIG. 3 is a plane view showing a whole structure of a master-slice type semiconductor device according to the present invention.
Figure 4:
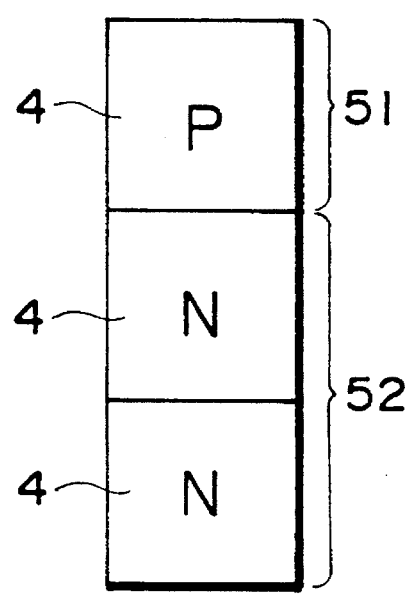
FIG. 4 is a plane view showing an array of a cell array formed on a main surface of a semiconductor wafer.
Figure 5:
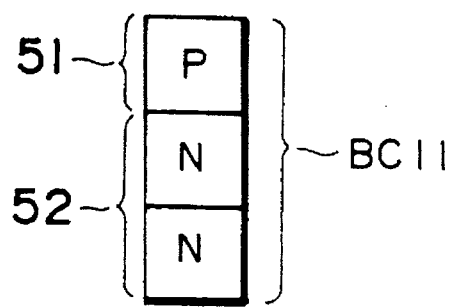
FIG. 5 and FIG. 6 are views showing an array condition of a basic cell (BC11, BC12).
Figure 6:
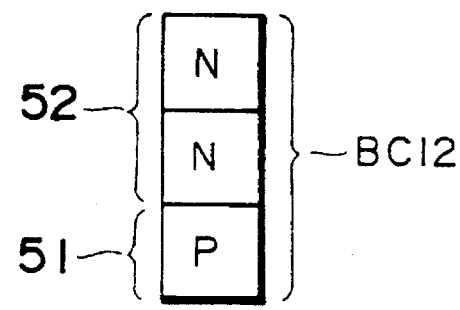

The embodiments of the present invention will be described hereunder with reference to the accompanying drawings. In figures, the same parts and regions are represented by the same reference numerals and the repetitive description is omitted.

Figure 11:
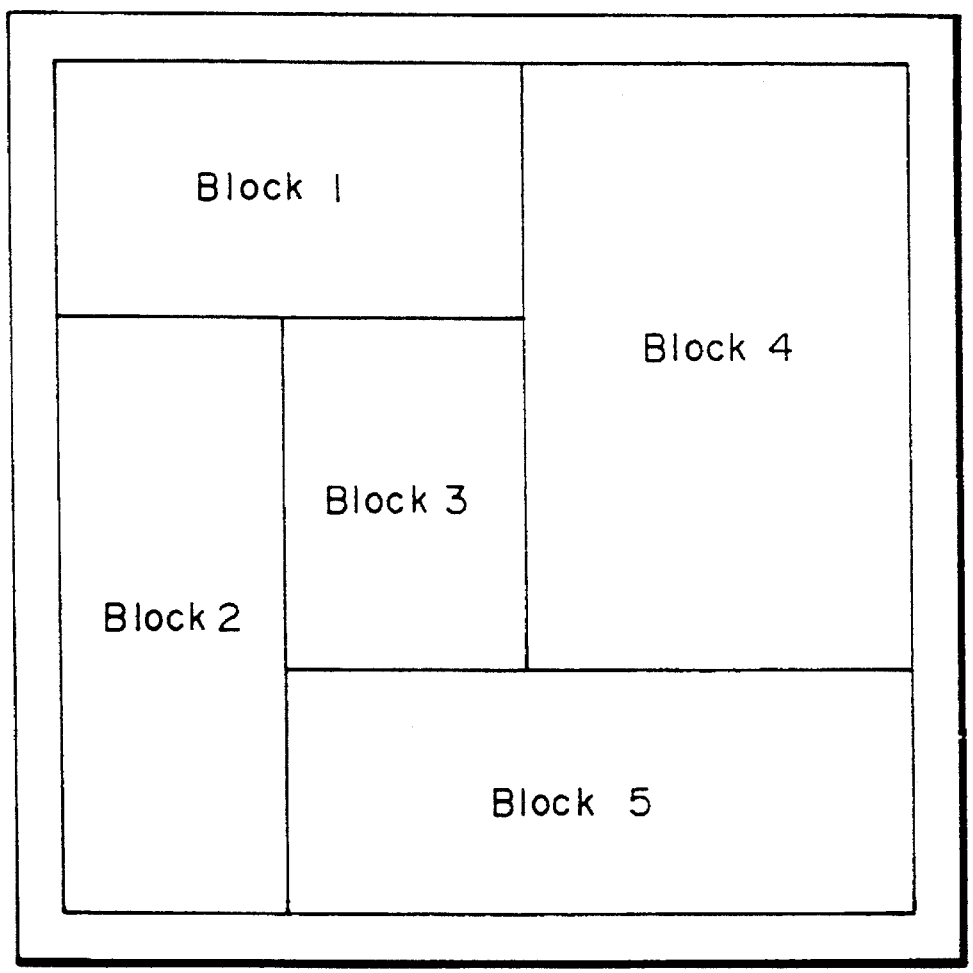
FIG. 11 is a plane view showing a whole main surface of a master-slice type semiconductor device.

An array of each channel region 4 (constituting a circuit block 5) to constitute a master-slice is shown in FIG. 12. The regions indicated by reference marks P and N represent a P-channel region in which a P-channel transistor is to be formed and an N-channel region in which an N-channel transistor is to be formed, respectively. Further, the above-described circuit block 5 comprises a plurality of column patterns. Further, FIG. 11 shows an example of a whole main surface of the master-slice type semiconductor device.

Figure 7:
FIG. 7 and FIG. 8 are views showing a wiring region used in a basic cell.
Figure 8:
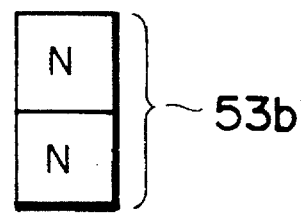
Figure 9:
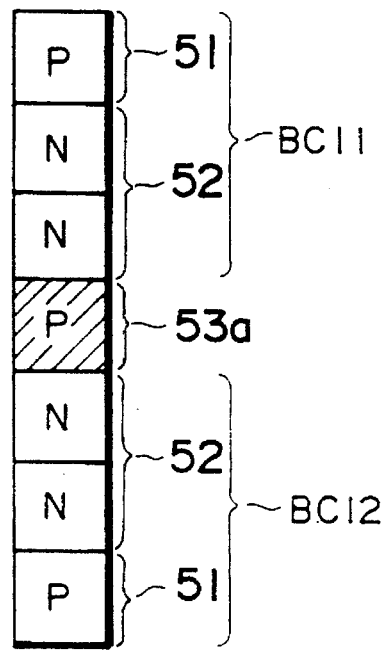
FIG. 9 to FIG. 10 are views showing a symmetrical pattern about a wiring region constituting a column pattern.
Figure 10:
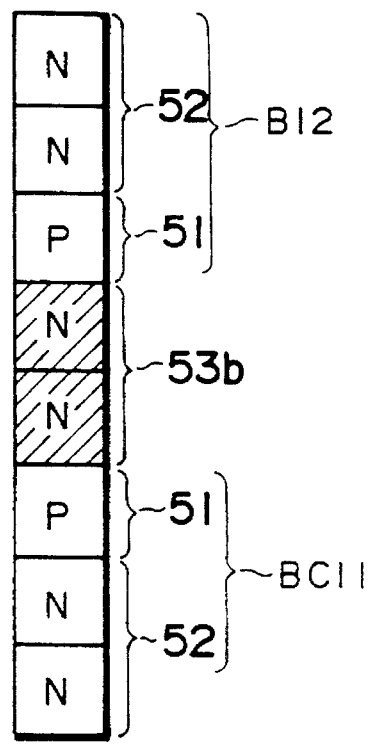

Each column pattern is such that the P-channel region and the two N-channel regions which are the same in size are arrayed alternately. Then, in a case of applying a metal wiring on a circuit block 5, the wiring region 53 (FIGS. 7 and 8) is utilized for the wiring between logical gates formed in basic cells.

It is noted that in the following explanations, only a single column pattern 6 will be explained for clarity. Further, an upper side of any channel region means the upper side of paper on which a figure is shown, and a bottom side of any channel region means the bottom side of paper on which a figure is shown.

Each N-channel region constituting the second region 52 is formed in the same figure and size, thereby the column pattern 6 partially has a symmetrical property, so that either the P-channel region or the pair of N-channel regions can be assigned for the wiring region (this assigned region is a wiring region). In other words, as shown in FIG. 12, in a case that the P-channel region (the wiring region 53a) is assigned for the wiring region, basic cells on the upper side and the bottom side of the region are a "P-N-N" (BC11) and an "N-N-P" (BC12), respectively. These basic cells BC11 and BC12 which have the same function can be formed, in which only an order of the array of the channel region 4 (two kinds of the P-channel region and the N-channel region) is inverse of the other basic cell.

Further, in a case that the wiring is also applied to the bottom side of the basic cell BC12, the wiring region 53b constituted by one pair of N-channel regions is assigned for the wiring region, so that the basic cell BC11 (order of array is "P-N-N") is further formed on the bottom side of the wiring region 53b. For the wiring pattern which is applied onto the basic cell, the wiring pattern can only be inverted at the position where the base cell is inverted, therefore the wiring can be easily designed.

Figure 14:
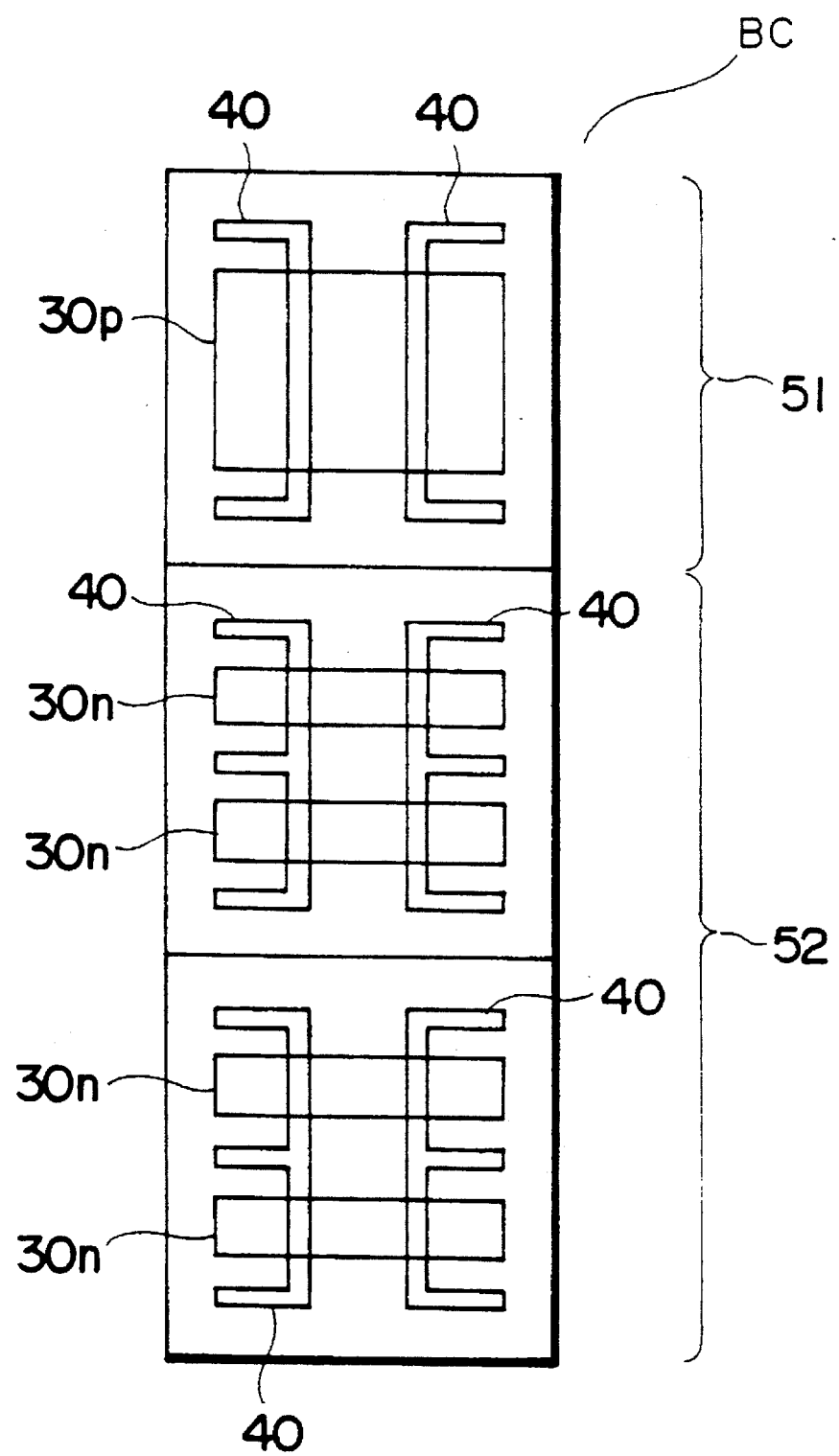
FIG. 14 is a plane view showing a detailed structure of a basic cell according to the present invention.

The structure of the basic cell BC is definitely shown in FIG. 14. The basic cell BC comprises the first region 51 and the second region 52, and symmetric two N-type active layers 30n are formed in each N-channel region, thereby each N-channel region is the same in figure and size.

In the P-channel region which is the first region 51, one pair of gate electrodes 40 and one P-type active layer 30p across the pair of gate electrodes 40 are formed. Further, in each N-channel region which is the second region 52, two N-type active layers 30n separated each other are formed, and in each N-type active layer 30n one pair of gate electrodes 40 are formed (four transistors are formed in one N-channel region). Thus, the two N-channel regions constituting the second region have the same structure (size is also the same).

If the second region 52 is constituted with such a structure, it is extremely effective for a case of forming a dual port RAM in one basic cell BC. Reasons for this will be explained with reference to FIG. 14. That is, in the case of forming the dual port RAM, a transfer gate is formed in the N-channel region (bottom side of FIG. 14) located at the end of the basic cell BC, and an invertor which is a component of a flip-flop circuit is formed in the N-channel region located at the center portion of the basic cell BC together with an adjacent P-channel region (middle channels region of FIG. 14). Accordingly, in the two N-channel regions constituting the second region 52, one of the N-channel regions becomes a component of the invertor and the other N-channel region constitutes a transfer gate in accordance with an assignment of each channel region constituting a basic cell BC.

Figure 15:
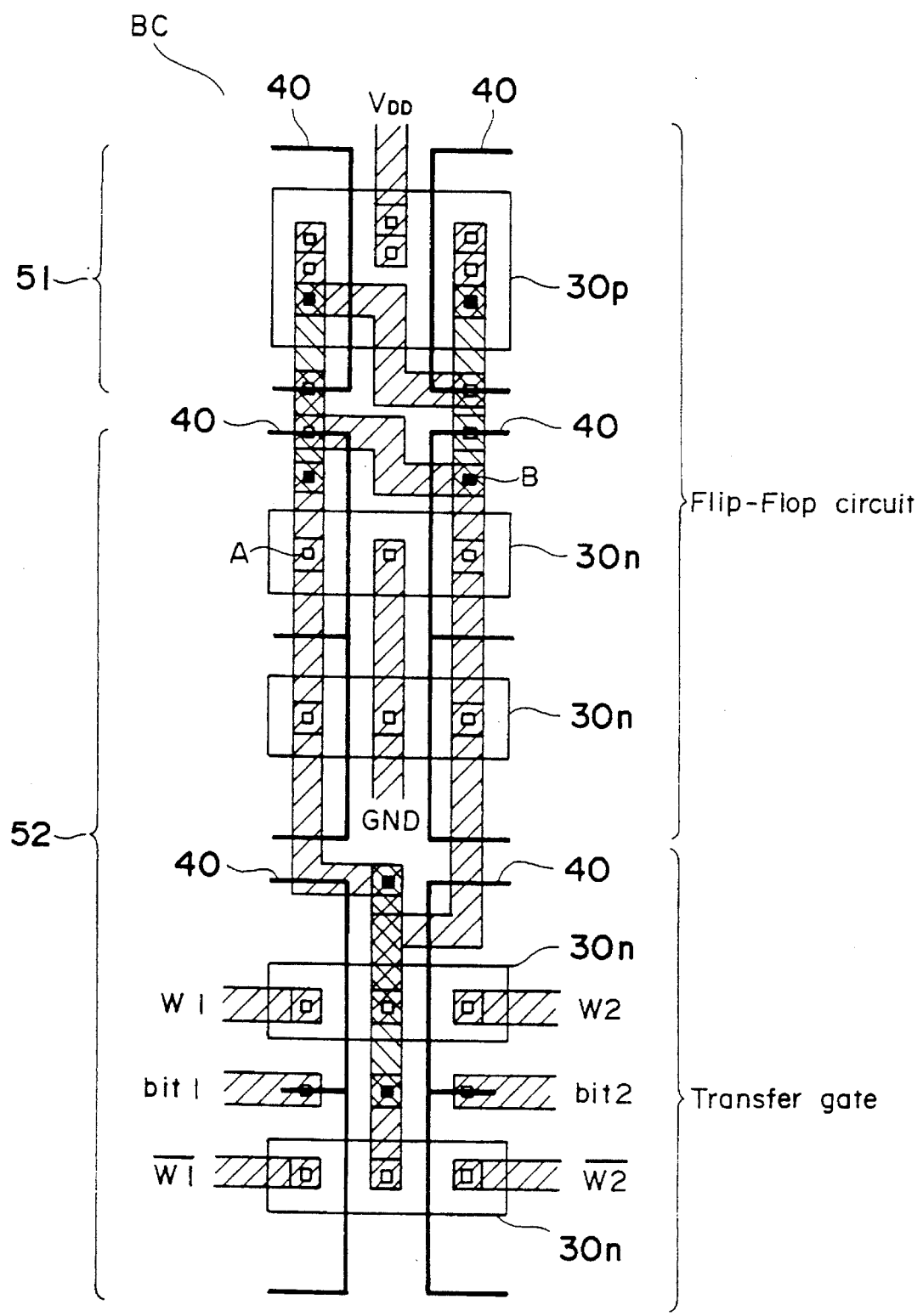
FIG. 15 is a plane view showing a wiring pattern constituting a dual port RAM which is applied to a basic cell (BC).
Figure 16:
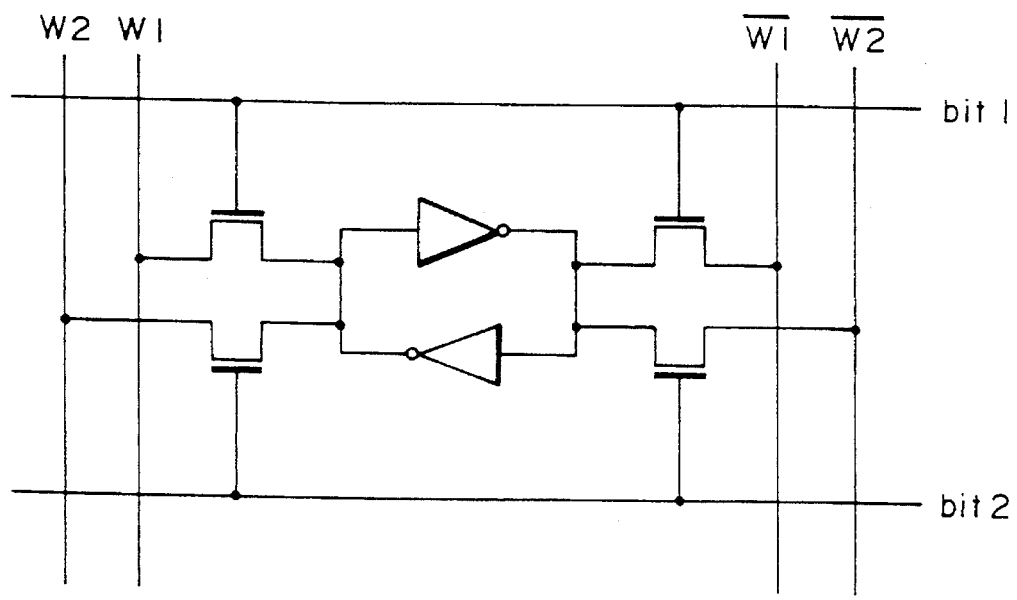
FIG. 16 is a circuit diagram showing a circuit of a dual port RAM.

The dual port RAM constituted with the wiring on the basic cell BC is shown in FIG. 15. Moreover, the circuit diagram of the dual port RAM is shown in FIG. 16. In FIG. 15, a white rectangular (indicated by A in FIG. 15) shows a contact between each active layer and a first Al layer which is a wiring and a black rectangular (indicated by B in FIG. 15) shows a contact between the first Al layer and a second Al layer. In the N-channel region located in a middle portion of FIG. 15, sources of transistors are connected in common and drains of transistors are connected in common. By applying the Al wiring in such manner, the two N-type active layers 30n separately formed can be used together and necessary driving capacity can be obtained. On the other hand, in the N-channel region (bottom side of FIG. 15) located in the lowest portion, a total of four transistors which exist between each word line W1 and W2 (signal level of these word line is a binary of "High" and "Low") and bar W1 and bar W2 (logic is inverse of the word lines W1 and W2) constitute transfer gates. Further, one pair of gate electrodes 40 are connected to bit lines bit1 and bit2. In FIG. 15, an Al wiring pattern for a case that an order of array in each channel region is "P-N-N" is shown but for a case that the order of array is "N-N-P" (order of the basic cell BC11), the Al wiring pattern can be used as it is if the pattern of the Al Wiring is inverted.

In a case that the dual port RAM is thus constituted, all transistors in the basic cell are effectively used and more the region for the wiring only is not required, therefore integration density is remarkably improved.

Thus described above, in the master-slice type semiconductor device according to the present invention, the second region which constitutes a basic cell is constituted by the two N-channel regions which are the same in figure and size, so that the array of each channel region constituting each column pattern can be symmetrical. Further, the wiring region has the same structure as the P-channel region or the two N-channel regions, so that in the case of utilizing the wiring region, the basic cells adjacent to the both sides of the wiring region are formed into the inverse pattern of the other cell.

Therefore, in a conventional master-slice type semiconductor device, in a case of forming a wiring on a cell array, the whole region of "P-N-N" which constitutes a basic cell has to be utilized for the wiring region, but in the master-slice type semiconductor device according to the present invention, unnecessary wiring region is not required, so that the use rate of gate is improved and the basic cell can be highly integrated.

Further, the wiring pattern applied to the basic cell can be used as it is if the wiring pattern is inverted, so that in semi-custom design techniques, the design of the LSI is facilitated.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A master-slice-type semiconductor device comprising a cell array on a main surface of the semiconductor device, the cell array arranged in a matrix of basic cells adjoining each other, each of the basic cells comprising only one P-channel region and two N-channel regions, the two N-channel regions having a same size and shape, wherein only one P-type active layer is formed in the only one P-channel region and two separated N-type active layers are formed in each of the two N-channel regions.

2. A master-slice-type semiconductor device according to claim 1, wherein the only one P-channel region is between one of the two N-channel regions and an N-channel region of an adjacent basic cell.

3. A master-slice-type semiconductor device according to claim 2, wherein the cell array is divided into a number of columns, each of the number of columns comprising wiring regions and a plurality of the basic cells, each of the wiring regions being one of the only one P-channel region and the two N-channel regions.

4. A master-slice-type semiconductor device according to claim 2, wherein each of the basic cells comprises:

the only one P-channel region further comprising a pair of gate electrodes across the P-type active layer; and the two N-channel regions, each of the two N-channel regions further comprising a pair of gate electrodes formed across the two N-type active layers, each of the gate electrodes having a branch between the two N-type active layers.

5. A master-slice-type semiconductor device according to claim 1, wherein the cell array is divided into a number of columns, each column comprising a plurality of the basic cells, wherein each column has wiring regions, each wiring region comprising one of the P-channel region and the two N-channel regions.

6. A master-slice-type semiconductor device according to claim 1, wherein each of the basic cells comprises:

the only one P-channel region further comprising a pair of gate electrodes across the P-type active layer; and the two N-channel regions, each of the N-channel regions further comprising a pair of gate electrodes formed across the two N-type active layers, each of the gate electrodes having a branch between the-two N-type active layers.

7. A master-slice-type semiconductor device comprising a cell array on a main surface of the device, said cell array formed into a matrix having channel regions adjoining each other, each of said channel regions having one of a first conductivity type and a second conductivity type, said master-slice-type semiconductor device comprising:

said cell array formed of a plurality of adjoining columns of channel regions, each row of the adjoining channel regions having a same channel type; and said column having a plurality of basic cells of said channel regions, each of said basic cells of channel regions including:

a first region having only one channel region of the first conductivity type, wherein only one active layer is formed in the first region;

a second region adjoining said first region and having two channel regions of the second conductivity type, the two channel regions having a same size, wherein two separated active layers are formed in each of the two channel regions and only one first region is between the second region and a second region of an adjacent basic cell.

8. A master-slice-type semiconductor device according to claim 7, wherein said channel region of the first conductivity type is a P-type region; and said channel region of said second conductivity type is an N-type region.

9. A master-slice-type semiconductor device according to claim 8, wherein said channel region of said second conductivity type comprises at least two active layers, said two active layers being separated.

10. A master-slice-type semiconductor device according to claim 9, wherein two transistors are formed in each said active layer.

* * * * *